(12) United States Patent
Prasad et al.

(10) Patent No.: US 12,315,545 B2
(45) Date of Patent: May 27, 2025

(54) SYSTEMS, DEVICES, AND METHODS OF CACHE MEMORY

(71) Applicant: Arm Limited, Cambridge (GB)

(72) Inventors: Divya Madapusi Srinivas Prasad, San Jose, CA (US); Krishnendra Nathella, Austin, TX (US); David Victor Pietromonaco, Cupertino, CA (US)

(73) Assignee: Arm Limited, Cambridge (GB)

( * ) Notice: Subject to any disclaimer, the term of this patent is extended or adjusted under 35 U.S.C. 154(b) by 180 days.

(21) Appl. No.: 17/866,448

(22) Filed: Jul. 15, 2022

(65) Prior Publication Data
US 2024/0021232 A1    Jan. 18, 2024

(51) Int. Cl.
*G11C 11/406* (2006.01)
*G11C 11/409* (2006.01)

(52) U.S. Cl.
CPC ...... *G11C 11/40607* (2013.01); *G11C 11/409* (2013.01)

(58) Field of Classification Search
CPC .............................. G11C 11/40607
USPC .................................. 365/222
See application file for complete search history.

(56) References Cited

U.S. PATENT DOCUMENTS

2004/0120191 A1* 6/2004 Nakase ............. G11C 15/00
　　　　　　　　　　　　　　　　　　711/E12.042
2018/0365154 A1* 12/2018 Ranjan ............ G11C 11/1675

OTHER PUBLICATIONS

Meinerzhagen, et al.; Gain-Cell Embedded DRAMs for Low-Power VLSI Systems-on-Chip; Springer International Publishing AG; 2018. DOI 10.1007/978-3-319-60402-2.

* cited by examiner

*Primary Examiner* — Anthan Tran
(74) *Attorney, Agent, or Firm* — Pramudji Law Group PLLC; Ari Pramudji

(57) ABSTRACT

According to one implementation of the present disclosure, a cache memory includes: a plurality of cache-lines, wherein each row of cache-lines comprises: tag bits of a tag-random access memory (tag-RAM); data bits of a data-random access memory (data-RAM), and a single set of retention bits corresponding to the tag-RAM. According to one implementation of the present disclosure, a method includes: sampling a single set of retention bits of a cache-line of a cache memory, where the cache-line comprises the single set of retention bits, tag-RAM and data-RAM, and where at least the single set of retention bits comprise eDRAM bitcells; and performing a refresh cycle of at least the data-RAM corresponding to the tag-RAM based on the sampled single set of retention bits.

19 Claims, 11 Drawing Sheets

| Ret0 | Ret1 | Status |
|---|---|---|
| 0 | 0 | Invalid |
| 0 | 1 | Valid |
| 1 | 0 | Invalid |
| 1 | 1 | Invalid |
FIG. 6
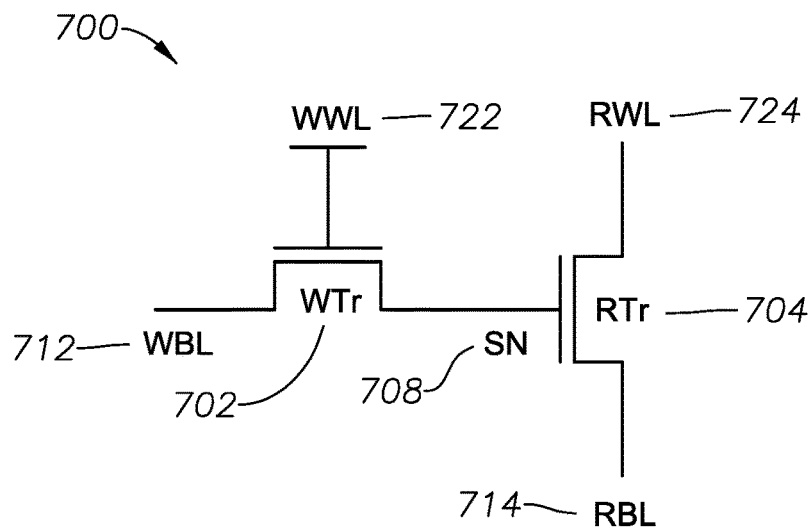
FIG. 7
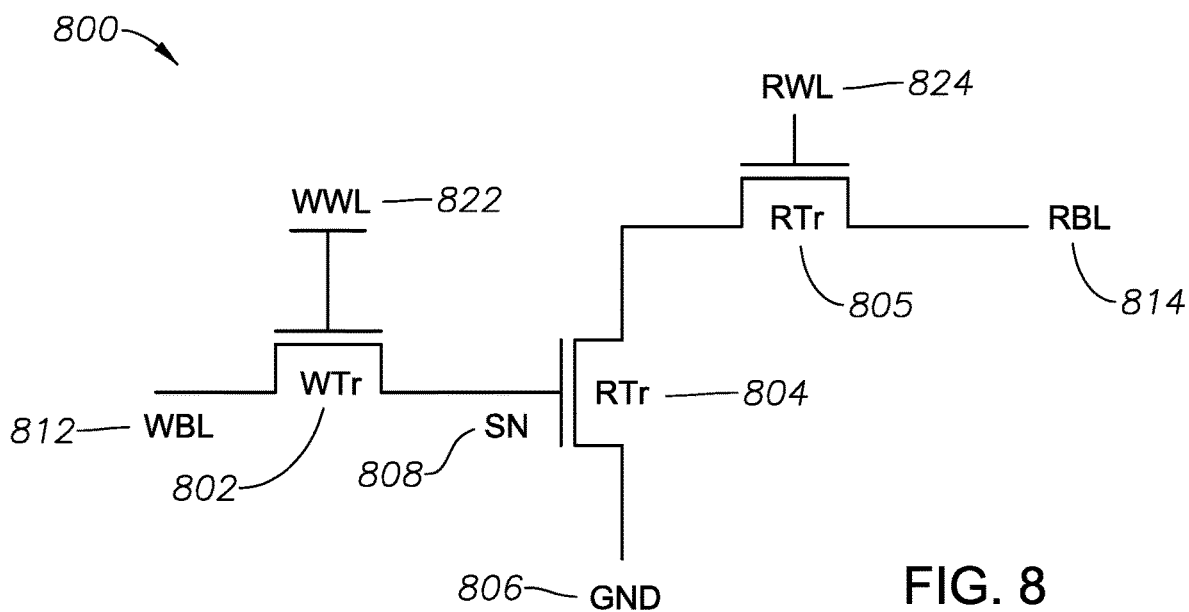
FIG. 8

SYSTEMS, DEVICES, AND METHODS OF CACHE MEMORY

I. FIELD

The present disclosure is generally related to systems, devices and methods of cache memory design and operation.

II. DESCRIPTION OF RELATED ART

Advances in technology have resulted in smaller and/or more powerful computing devices, with ever growing power, performance, area and cost (PPAC) demands. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities.

As may be appreciated, for cache memory in computing devices, traditional designs utilize static random access memory (SRAM) for large cache on-chip applications. Traditionally, SRAM-based memory has been preferred due its speed and reliability. Another alternative for memory design includes the usage of eDRAM (i.e., embedded of dynamic random-access-memory). However, at room temperature operation, eDRAM may not be attractive. As a characteristic, eDRAM leaks current rapidly, and thus its retention time (i.e., the capacity to hold memory data) would be a short timeframe in microseconds. Hence, challenges to the implementation of eDRAM include the frequent requirement for refresh operations, and that such operations for refresh or dynamic refresh may be energy intensive and redundant when cache and refresh monitoring is handled separately. Accordingly, there is an ongoing need in the art for optimization in eDRAM utilization for various memory operations.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

FIG. 6 is a diagram illustrating certain aspects of various implementations described herein.

FIG. 7 is a circuit in accordance with various implementations described herein.

FIG. 8 is a circuit in accordance with various implementations described herein.

Figure 1:
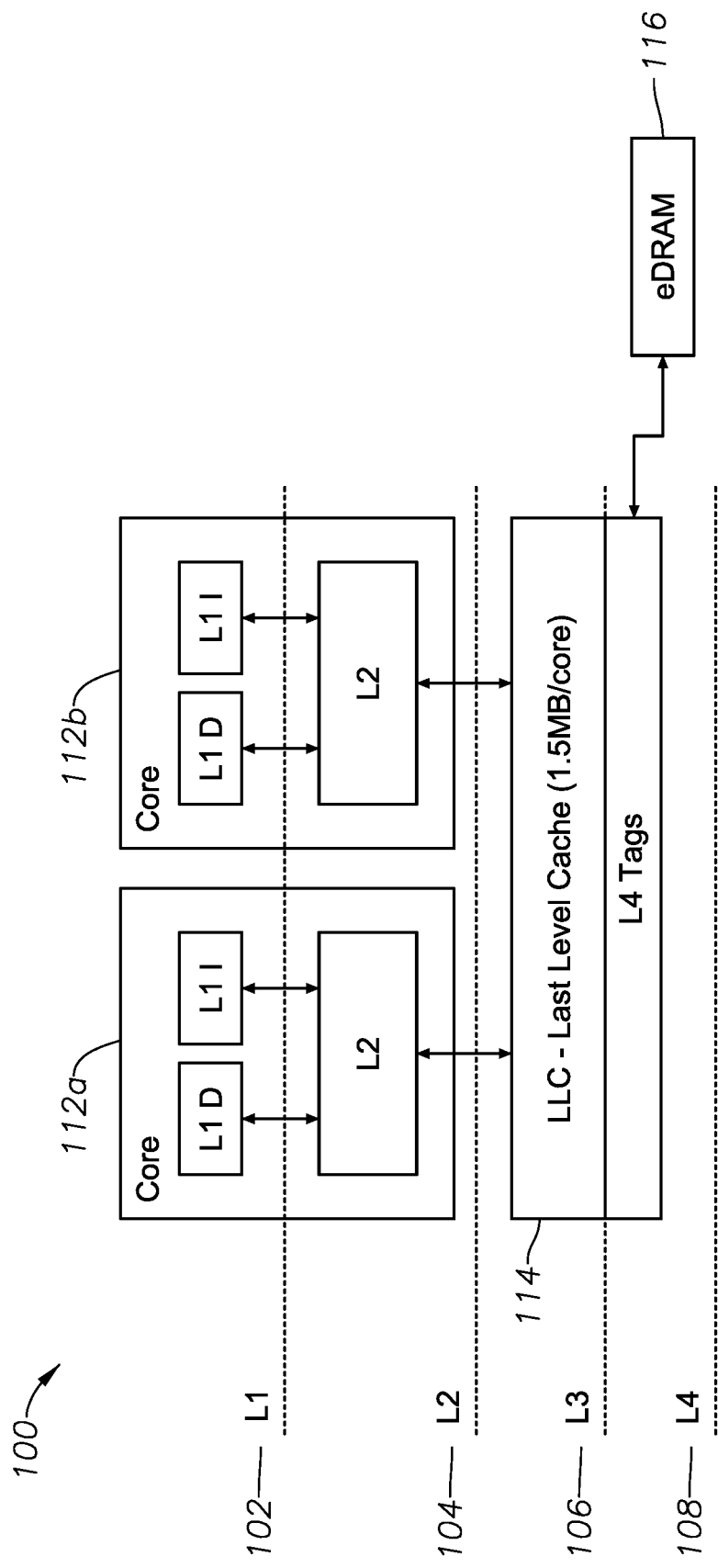
FIG. 1 is a diagram in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration and many of the units are normalized to showcase relative trends. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. While certain diagrams as illustrated herein are shown in two-dimensions, aspects of the diagrams as provided herein are to be understood to be three-dimensional having X, Y and Z axes. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, a cache memory includes: a plurality of cache-lines, wherein each row of cache-lines comprises: tag bits of a tag-random access memory (tag-RAM); data bits of a data-random access memory (data-RAM), and a single set of retention bits corresponding to the tag-RAM.

According to one implementation of the present disclosure, a method includes: sampling a single set of retention bits of a cache-line of a cache memory, where the cache-line comprises the single set of retention bits, tag-RAM and data-RAM, and where at least the single set of retention bits comprise eDRAM bitcells; and performing a refresh cycle of at least the data-RAM corresponding to the tag-RAM based on the sampled single set of retention bits.

According to one implementation of the present disclosure, a method includes: sampling a single set of retention bits of a cache-line of a cache memory, where the cache-line comprises the single set of retention bits, tag-RAM and data-RAM, and wherein first and second retention bits of the cache-line comprise eDRAM bitcells; and determining a retention of data bits of the data-RAM based on the sampled single set of retention bits.

As may be appreciated, the use of eDRAM (i.e., embedded of dynamic random-access-memory) (e.g., a gain cell DRAM) for memory in computing devices can be attractive because it utilizes lower energy, lower static power, and sometimes lower dynamic power as well. Moreover, in comparison to SRAM (i.e., static random access memory), eDRAM is smaller and thus, would utilize less transistors (e.g., three transistors or less for eDRAM, while SRAM would require six transistors). Further, as another feature, in eDRAM, there are separate read and write transistors, read and write operations may be performed separately. Hence, the utilization of eDRAM provides for parallelism and allows for an instructions per clock cycle (IPC) boost that inherently would not be achieved by, for example, six-transistor (6T) SRAMs.

Advantageously, inventive aspects of the present invention include the capacity to enable dynamic refresh by utilizing a single set of retention bits per cache-line in a cache memory. According to some inventive aspects, advantageously, eDRAM may also be implemented for both data-RAM and tag-RAM in cache memory. Moreover, a circuit designer may track the retention of the data using one single set of retention bits, as the tag-RAM and data-RAM would be written into as pairs (e.g., "hand-in-hand"). Hence, when there would be an entry in tag-RAM, as well as a matching entry in the data-RAM (e.g., where the data is written). In certain operations, as described herein, once the retention bits (e.g., as a canary circuit) indicate that a refresh is needed, inventive systems, devices, and methods, as discussed herein, can be configured to refresh the tag bits of the tag-RAM and the corresponding data bits of the data-RAM.

Aspects of the present invention include the capacity to utilize eDRAM and the refresh operation thereto optimally. In implementations, inventive aspects can also allow for optimized tuning of bitcells for various caches in memory subsystems or specific related applications. Hence, certain schemes and techniques can provide for profiling of a workload itself and the deriving of critical retention time. Correspondingly, based on a critical retention time, as discussed herein, transistor bitcells may be "tuned" to achieve a desired retention time.

Specifically, in certain implementations, for memories that are volatile charge-based memories, as well as MRAM (magneto-resistive random-access memory), inventive aspects provide for the capacity to determine the retention time for different caches across various cache designs (e.g., L1, L2, L3 cache) through workload profiling, and utilizing application-specific data. For instance, data would not reside in L1 cache, as long as it resides in L2 cache. Correspondingly, bitcells as well as transistors of the bitcell may be designed. Accordingly, in certain implementations, the threshold voltage of the transistors may be tuned such that a predetermined retention time may be achieved, where the target(s) for the retention time may be provided from workload profiling. Through such a matching procedure (e.g. SRAM performance matching), performance and power may be optimized.

Referring to FIG. 1, a diagram of an example cache-memory layout 100 is shown. As illustrated, the cache-memory layout may include four types of cache memory: L1 (i.e., level 1 cache layer), L2 (i.e., level 2 cache layer), L3 (i.e., level 3 cache layer), and L4 (i.e., level 4 cache layer). In certain implementations, as shown, the L1 and L2 cache memory are included in the memory core, L3 may be last level cache (LLC), and L4 may be tags. Also, the eDRAM may be coupled to the L4. In some instances, the eDRAM may be dynamically split for CPU or GPU requests. Correspondingly the eDRAM may be used in CPU-mode when integrated graphics would not be in use, or GPU-mode when texture caching would be required.

Advantageously, inventive aspects allows for eDRAM to be used not just for L3 and L4 cache, where power and area would be the primary concern, but L1 cache as well, where speed would be critical. In certain aspects, as described herein, allows for the tuning of the eDRAM to be an effective L1 cache, where it can now be utilized in tag-RAM as well.

In certain operations, for SRAM, the procedure to perform a refresh would utilize a pointer to the data that is stored in the data-RAM as well as a valid bit to indicate the validity of the particular cache-line. In contrast, for eDRAM, advantageously, two retention bits may be added. For example, in operation, a "weak" (e.g. "deteriorated") (e.g., data presence below a certain predetermined threshold) "0" data and "1" data values may be written to the cache. Next, the weak data may be read until a such a time where the "1" and "0" data values would be indistinguishable (e.g., similar to a canary circuit). At this point it would be known that the specific cache requires a refresh. To perform such an operation, retention bits may be added to each cache-line or each RAM (e.g., tag-RAM or data-RAM) separately to track each cache-line. Moreover, in some instances, there would be no correlation between the tag and the data. Accordingly, in certain inventive aspects, the retention bits (e.g., the tag-RAM retention bits) may be used to track the data-RAM or the refresh operation as well. Advantageously, in some implementations, by using embedded DRAM for both tag-RAM and data-RAM, one now has the capacity to track the retention of the data. In contrast, known SRAM-based designs where SRAM is used for both tag-RAM and data-RAM, there would be no need for retention bits. Hence, for example, in accordance with inventive aspects, when there is an entry in tag-RAM, a matching cache line in the data-RAM (where the data is written), and the corresponding retention bits indicate as a canary circuit (e.g., indistinguishable), an indication may be provided that a refresh is needed or that the data is corrupt, and thus, invalid. Accordingly, the tag bits the corresponding data bits may then be refreshed.

Figure 2:
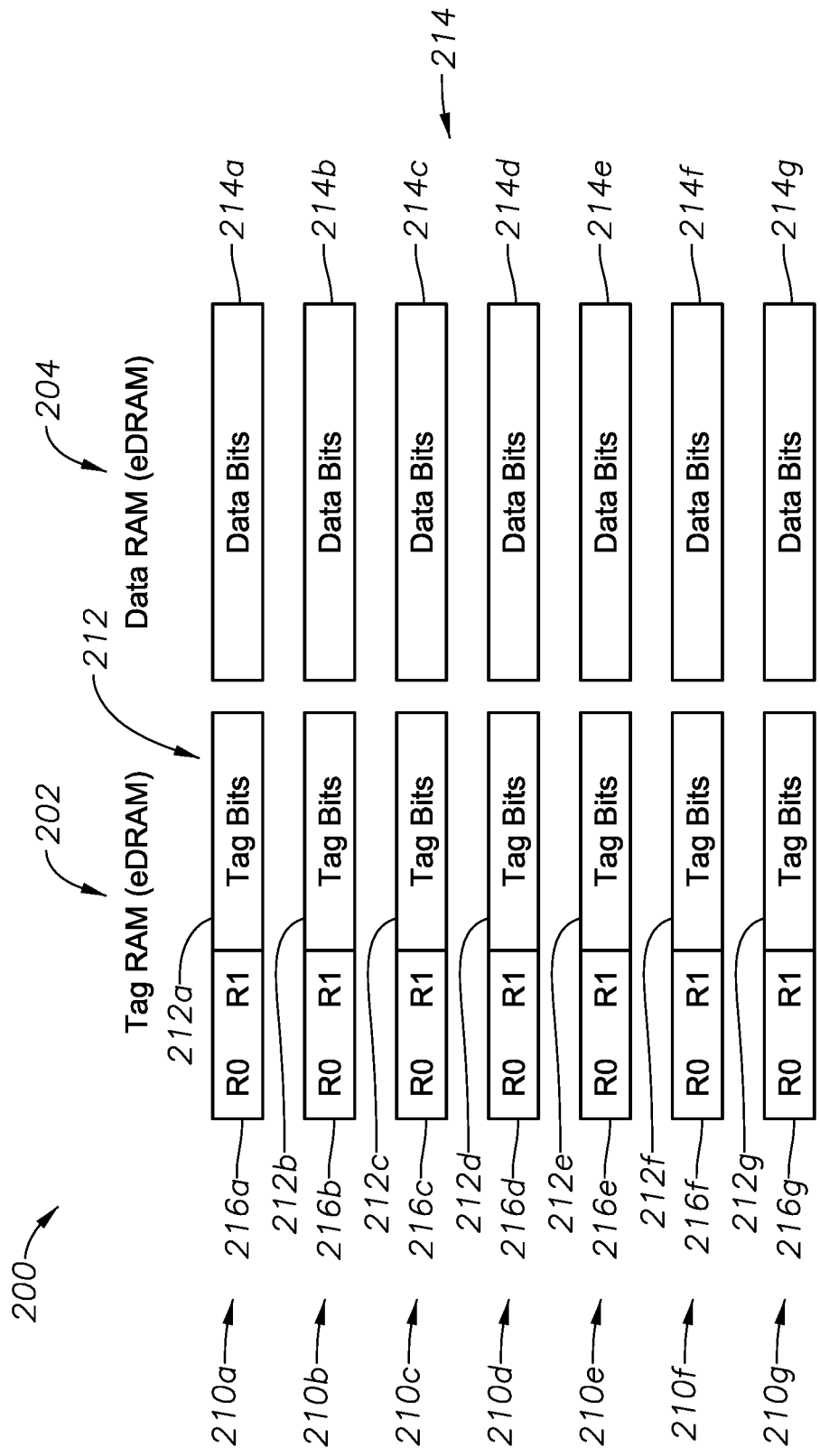
FIG. 2 is a diagram illustrating certain aspects of various implementations described herein.

Referring to FIG. 2, an example representation of a cache memory 200 is shown according to example implementations. As illustrated, the cache memory 200 may be an all eDRAM implementation and include a plurality of cache-lines 210 (e.g., 210a, 210b, 210c, 210d, 210e, 210f, 210g). In certain implementations, for example, each row of cache-lines includes: tag bits (tag ram bits) 212 (e.g., 212a, 212b, 212c, 212d, 212e, 212f, 212g) of a tag RAM (random access memory) 202; data bits (data ram bits) 214 (e.g., 214a, 214b, 214c, 214d, 214e, 214f, 214g) of a data-random access memory (data-RAM) 204; and a single set of retention bits (e.g., R0, R1) 216 (e.g., 216a, 216b, 216c, 216d, 216e, 216f, 216g) corresponding to (i.e., associated with) the tag-RAM 202.

In certain implementations, the single set of retention bits 216 (e.g., 216a, 216b, 216c, 216d, 216e, 216f, 216g) corresponds to (e.g., "matches to", associated with) both the tag-RAM 202 and the data-RAM 204. As shown in FIG. 2, the tag-RAM 202 and data-RAM 204 comprise embedded-dynamic random access memory (eDRAM) bitcells. In various cases, the single set of retention bits 216 are stored in respective retention canary circuits (not shown). According to example operations, the single set of retention bits 216 may be configured to provide an early indication to perform a refresh cycle of at least one row of cache-lines ("early detection for refresh") of the data-RAM 204. In some instances, the single set of retention bits 216 comprises a lower retention duration in comparison to the tag bits 212 and the data bits 214.

Advantageously, with reference to FIG. 2, the memory 200 allows for the use of eDRAM for both tag-RAM and data-RAM. Such an implementation would be possible because each of the tag-RAM and data-RAM are written as pairs. In certain aspects, using a common retention canary circuit may be beneficial to performance, power and area. Moreover, there is a significant energy savings in polling and early detection for refresh operation, as well as the capacity to allow for failure and subsequently invalidation of respective cache-lines. Further, when conducting a refresh operation, only the tag-RAM would have to be polled (e.g., sampled), while the remaining bits can be masked.

Figure 3:
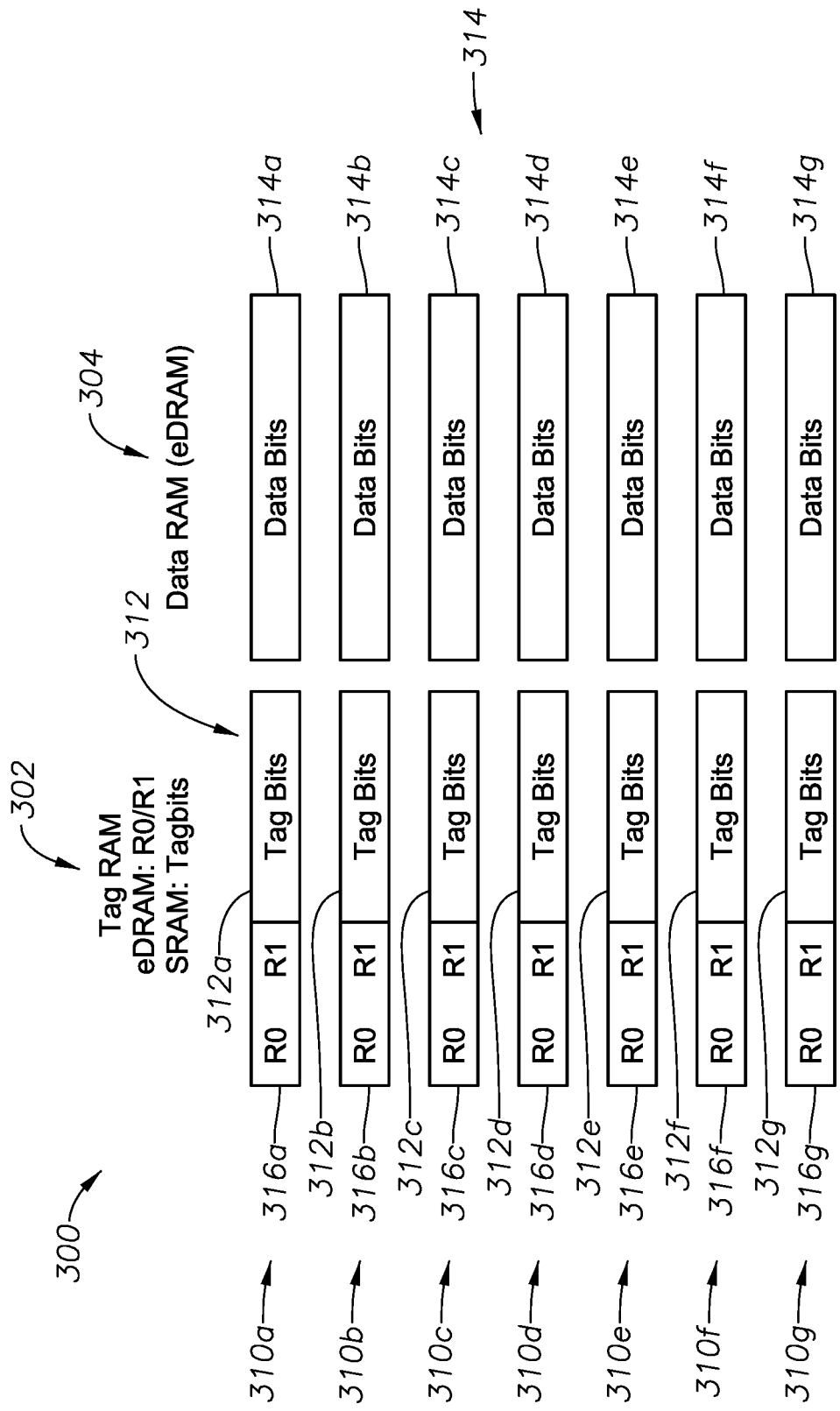
FIG. 3 is a diagram illustrating certain aspects of various implementations described herein.

Referring to FIG. 3, an example representation of a cache memory 300 is shown according to example implementations. As illustrated, the cache memory 300 may be a hybrid eDRAM/SRAM implementation and include a plurality of cache-lines 310 (e.g., 310a, 310b, 310c, 310d, 310e, 310f, 310g). In certain implementations, for example, each row of cache-lines includes: tag bits (tag ram bits) 312 (e.g., 312a, 312b, 312c, 312d, 312e, 312f, 312g) of a tag RAM (random access memory) 302; data bits (data ram bits) 314 (e.g., 314a, 314b, 314c, 314d, 314e, 314f, 314g) of a data-random access memory (data-RAM) 304; and a single set of retention bits (e.g., R0, R1) 316 (e.g., 316a, 316b, 316c, 316d, 316e, 316f, 316g) corresponding to (i.e., associated with) the tag-RAM 302.

In various implementations, the single set of retention bits 316 (e.g., 316a, 316b, 316c, 316d, 316e, 316f, 316g) corresponds to (e.g., "matches to") both the tag-RAM 302 and the data-RAM 304. As shown, the single set of retention bits 316 and the data-RAM 304 may comprise embedded-dynamic random access memory (eDRAM) bitcells, while the tag bits 312 may comprise static random access memory (SRAM) bitcells. In various cases, the single set of retention bits 316 are stored in respective retention canary circuits (not shown). According to example operations, the single set of retention bits 316 may be configured to provide an early indication to perform a refresh cycle of at least one row of cache-lines ("early detection for refresh") of the data-RAM 304. In some instances, the single set of retention bits 316 comprises a lower retention duration in comparison to the tag bits 312 and the data bits 314.

Advantageously, with reference to FIG. 3, the memory 300 allows for the use of eDRAM for the retention bits of the tag-RAM as well as the data-RAM. In such an implementation, the tag-bits of the tag-RAM are SRAM. Such an implementation would be possible because each of the tag-RAM and data-RAM are written as pairs. In certain aspects, using a common retention canary circuit may be beneficial to performance, power and area. Moreover, there is a significant energy savings in polling and early detection for refresh operation, as well as the capacity to allow for failure and subsequently invalidation of respective cache-lines. Further, robust SRAM bitcells may be utilized to track critical tag bits while eDRAM based retention bits may be used per each cache-line.

According to certain inventive aspects, with reference to FIGS. 2 and 3, each of the cache-lines may solely include the tag bits of the tag-RAM, the data bits of the data-RAM, and the single set of the retention bits (R0, R1). Advantageously, such implementations would not require or include a respective valid bit (V) (i.e., validation bit) for each cache-line (in contrast to FIGS. 4 and 5). Correspondingly, instead of a respective valid bit, the single set of retention bits would be configured to indicate a validity (e.g., non-corruption) of a particular cache-line (as well as used for refresh operation). Hence, the functionality of valid bits may be merged with that of retention bits. As may be appreciated, these implementations would be operable for read-only caches or write-through caches.

Figure 4:
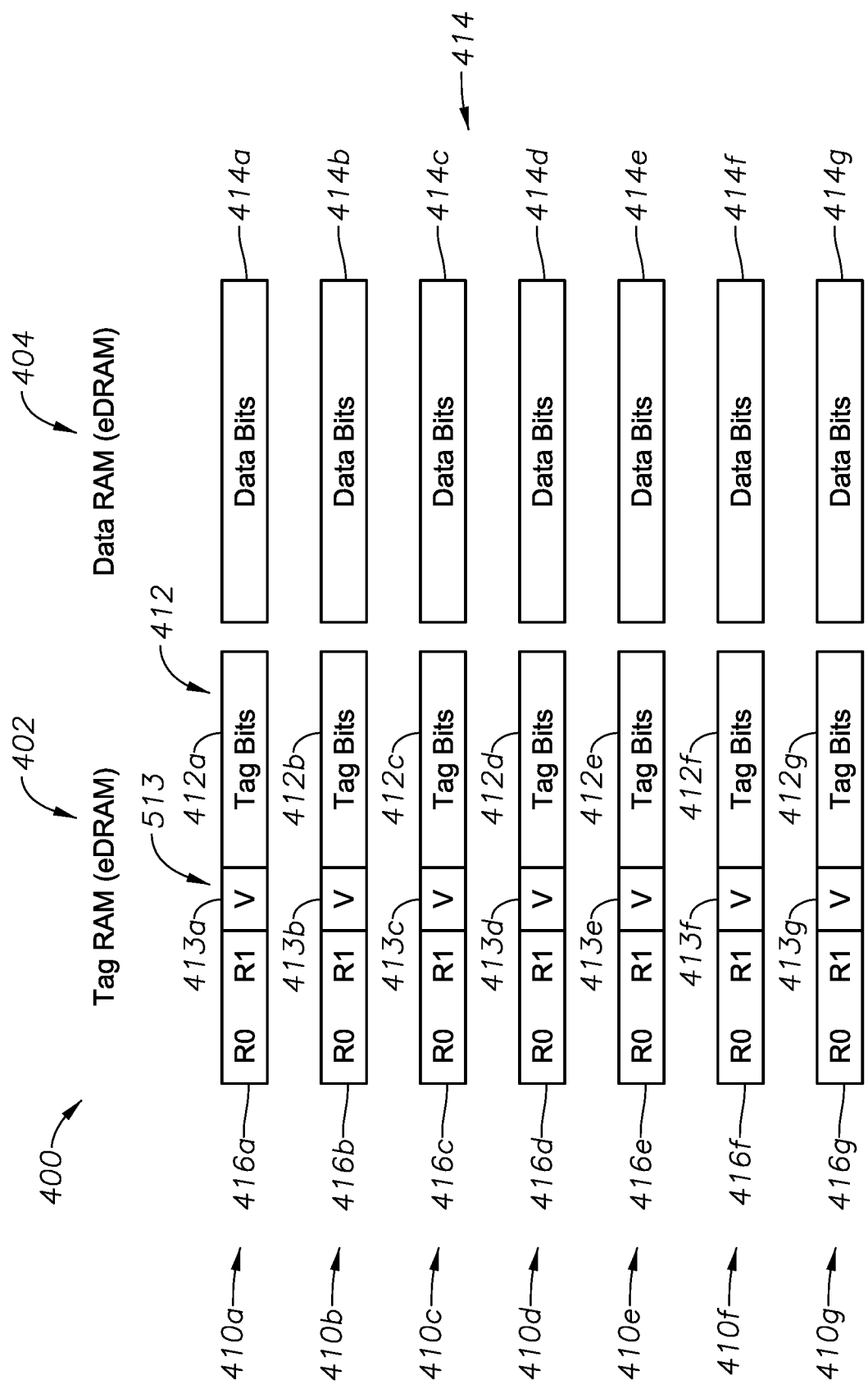
FIG. 4 is a diagram illustrating certain aspects of various implementations described herein.

Referring to FIG. 4, an example representation of a cache memory 400 is shown according to example implementations. As illustrated, the cache memory 400 may include a plurality of cache-lines 410 (e.g., 410a, 410b, 410c, 410d, 410e, 410f, 410g). In certain implementations, for example, each row of cache-lines includes: tag bits (tag ram bits) 412 (e.g., 412a, 412b, 412c, 412d, 412e, 412f, 412g) of a tag RAM (random access memory) 402; data bits (data ram bits) 414 (e.g., 414a, 414b, 414c, 414d, 414e, 414f, 414g) of a data-random access memory (data-RAM) 204; a valid bit 413 (e.g., 413a, 413b, 413c, 413d, 413e, 413f, 413g) and a single set of retention bits (e.g., R0, R1) 416 (e.g., 416a, 416b, 416c, 416d, 416e, 416f, 416g) corresponding to (i.e., associated with) the tag-RAM 402.

In certain implementations, the single set of retention bits 416 (e.g., 416a, 416b, 416c, 416d, 416e, 416f, 416g) corresponds to (e.g., "matches to", associated with) both the tag-RAM 402 and the data-RAM 404. Also, similar to other implementations, the single set of retention bits 416 may be stored in respective (retention) canary circuits. According to example operations, the single set of retention bits 416 may be configured to provide an early indication to perform a refresh cycle of at least one row of cache-lines (e.g., an "early detection for refresh") of the data-RAM 404. In some instances, the single set of retention bits 416 comprises a lower retention duration in comparison to the tag bits 412 and the data bits 414. With reference to FIG. 4, the valid bits 413 provides validation of the particular cache-line of the cache memory. As illustrated, the tag-RAM 402 and data-RAM 404 comprise embedded-dynamic random access memory (eDRAM) bitcells.

Advantageously, with reference to FIG. 4, the memory 400 allows for the use of eDRAM for both tag-RAM (including retention bits, validation bits, and tag bits) and data-RAM (including data bits). Such an implementation would be possible because each of the tag-RAM and data-RAM are written as pairs. In certain aspects, using a common retention canary circuit may be beneficial to performance, power and area. Moreover, there is a significant energy savings in polling and early detection for refresh operation, as well as the capacity to allow for failure and subsequently invalidation of respective cache-lines. Further, when conducting a refresh operation, only the tag-RAM would have to be polled (e.g., sampled), while the remaining bits can be masked.

Figure 5:
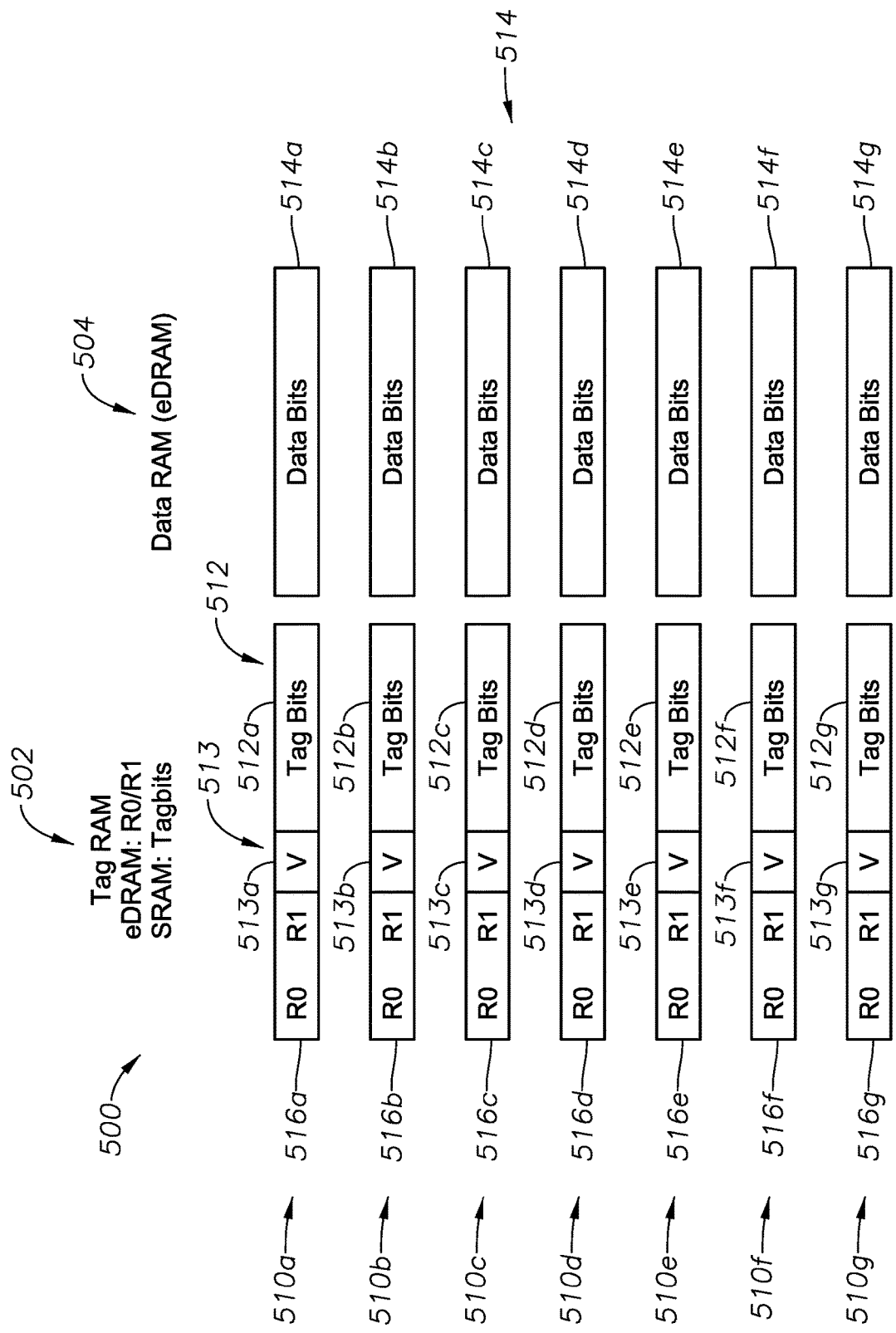
FIG. 5 is a diagram illustrating certain aspects of various implementations described herein.

Referring to FIG. 5, an example representation of a cache memory 500 is shown according to example implementations. As illustrated, the cache memory 500 may include a plurality of cache-lines 510 (e.g., 510a, 510b, 510c, 510d, 510e, 510f, 510g). In certain implementations, for example, each row of cache-lines includes: tag bits (tag ram bits) 512 (e.g., 512a, 512b, 512c, 512d, 512e, 512f, 512g) of a tag RAM (random access memory) 502; data bits (data ram bits) 514 (e.g., 514a, 514b, 514c, 514d, 514e, 514f, 514g) of a data-random access memory (data-RAM) 504; a valid bit 513 (e.g., 513a, 513b, 513c, 513d, 513e, 513f, 513g) and a single set of retention bits (e.g., R0, R1) 516 (e.g., 516a, 516b, 516c, 516d, 516e, 516f, 516g) corresponding to (i.e., associated with) the tag-RAM 502.

In certain implementations, the single set of retention bits 516 (e.g., 516a, 516b, 516c, 516d, 516e, 516f, 516g) corresponds to (e.g., "matches to", associated with) both the tag-RAM 502 and the data-RAM 504. Also, similar to other implementations, the single set of retention bits 512 may be stored in respective (retention) canary circuits. According to example operations, the single set of retention bits 512 may be configured to provide an early indication to perform a refresh cycle of at least one row of cache-lines 514 (e.g., an "early detection for refresh") of the data-RAM 504. In some instances, the single set of retention bits 516 comprises a lower retention duration in comparison to the tag bits 414 and the data bits 516. As illustrated, the data-RAM 504 and each set of retention bits 516 may include eDRAM bitcells, but the tag bits 512 of the tag-RAM 502 may include SRAM bitcells.

Advantageously, with reference to FIG. 5, the memory 500 allows for the use of eDRAM for the retention bits of the tag-RAM as well as the data-RAM. In such an implementation, the tag-bits of the tag-RAM and validation bits are SRAM. Such an implementation would be possible because each of the tag-RAM and data-RAM are written as pairs. In certain aspects, using a common retention canary circuit may be beneficial to performance, power and area. Moreover, there is a significant energy savings in polling and early detection for refresh operation. Further, robust SRAM bitcells may be utilized to track critical tag bits while eDRAM based retention bits may be used per each cache-line.

As may be appreciated, with reference to FIGS. 1-15, the tag-RAM may be configured to identify a particular data from main memory that would be currently stored in a particular cache-line of the plurality of cache-lines. In certain implementations, with reference to FIGS. 1-15, the single set of retention bits may correspond to the tag-RAM, data-RAM or the cache-line itself. In other implementations, multiple sets of retention bits may correspond to tag-RAM, data-RAM or the cache-line itself.

Referring to FIG. 6, an example graphical representation of a truth table corresponding to the cache memory 300 is shown according to example implementations. As illustrated, the truth table illustrates the four scenarios (0,0; 0,1; 1,0; 1,1) of digital data stored in the respective first and second retention bits R0 (e.g., Ret0), R1 (e.g., Ret1) and its corresponding status (e.g., either invalid or valid). As may be appreciated, such a proposed optimization may combine (e.g., "merge") the functionality of valid bits and retention bits, and hence remove the requirement of a separate valid bit. For instance, in one set of examples, as illustrated: when both the first and second retention bits are a digital "0" (i.e., stores a digital "0"), the status of cache-line would be invalid; when the first retention bit is a digital "0" and the second retention bit is a digital "1", the status of cache-line would be valid; when the first retention bit is a digital "1" and the second retention bit is a digital "0", the status of cache-line would be invalid; and further, when both the first and second retention bits are a digital "1" (i.e., stores a digital "1"), the status of cache-line would also be invalid.

Advantageously, such an implementation illustrates certain advantages over SRAM implementations as well as known eDRAM uses since valid bits would not be required and only a maximum of two retention bits would be need. In contrast, for example, in known SRAM designs, a valid bit would be present and for known eDRAM designs would require three separate bits (i.e., one bit for validation and two bits for retention tracking).

In certain implementations (not shown), the requirement to track (or sample) a cache-line would not be necessary since the retention bits themselves indicate whether cache-line bits are valid or invalid. For example, in such instances, only upon a cache read operation would the retention bits be checked to determine whether data is valid. Correspondingly, in such cases, the retention bits are not checked otherwise.

Referring to FIG. 7, an example eDRAM bitcell 700 (i.e., bitcell circuit design) utilized with example implementations is shown. As illustrated, the example eDRAM bitcell 700 may be a two-transistor gain cell dynamic-random memory (i.e., 2T GC-DRAM). The 2T GC-DRAM may include one write transistor (WTr) 702 and one read transistor (RTr) 704. In certain implementations, as illustrated, the write transistor 702 is coupled between a write bitline 712 and a storage node 708, while a write word line 722 is coupled to a gate terminal of the write transistor 702. Also, the read transistor 704 may be coupled between the read word line 724 and the read bit line 714, where a gate terminal of the read transistor 704 may be coupled to the storage node 708 and write transistor 702.

Referring to FIG. 8, an example eDRAM bitcell 800 (i.e., bitcell circuit design) utilized with example implementations is shown. As illustrated, the example eDRAM bitcell 800 may be a three-transistor gain cell dynamic-random memory (i.e., 3T GC-DRAM). The 3T GC-DRAM may include one write transistor (WTr) 802 and two read transistors (RTr) 804, 805. In certain implementations, as illustrated, the write transistor 802 is coupled between a write bit line 812 and a storage node 808, while a write word line 822 is coupled to a gate terminal of the write transistor 802. Also, the first read transistor 804 may be coupled between the second read transistor 805 and ground, where a gate terminal of the first read transistor 804 may be coupled to the storage node 808 and write transistor 702. Moreover, the second read transistor 805 may be coupled between the first read transistor 804 and the read bit line 814, where a read word line 824 may be coupled to a gate terminal of the second read transistor 805.

Figure 9:
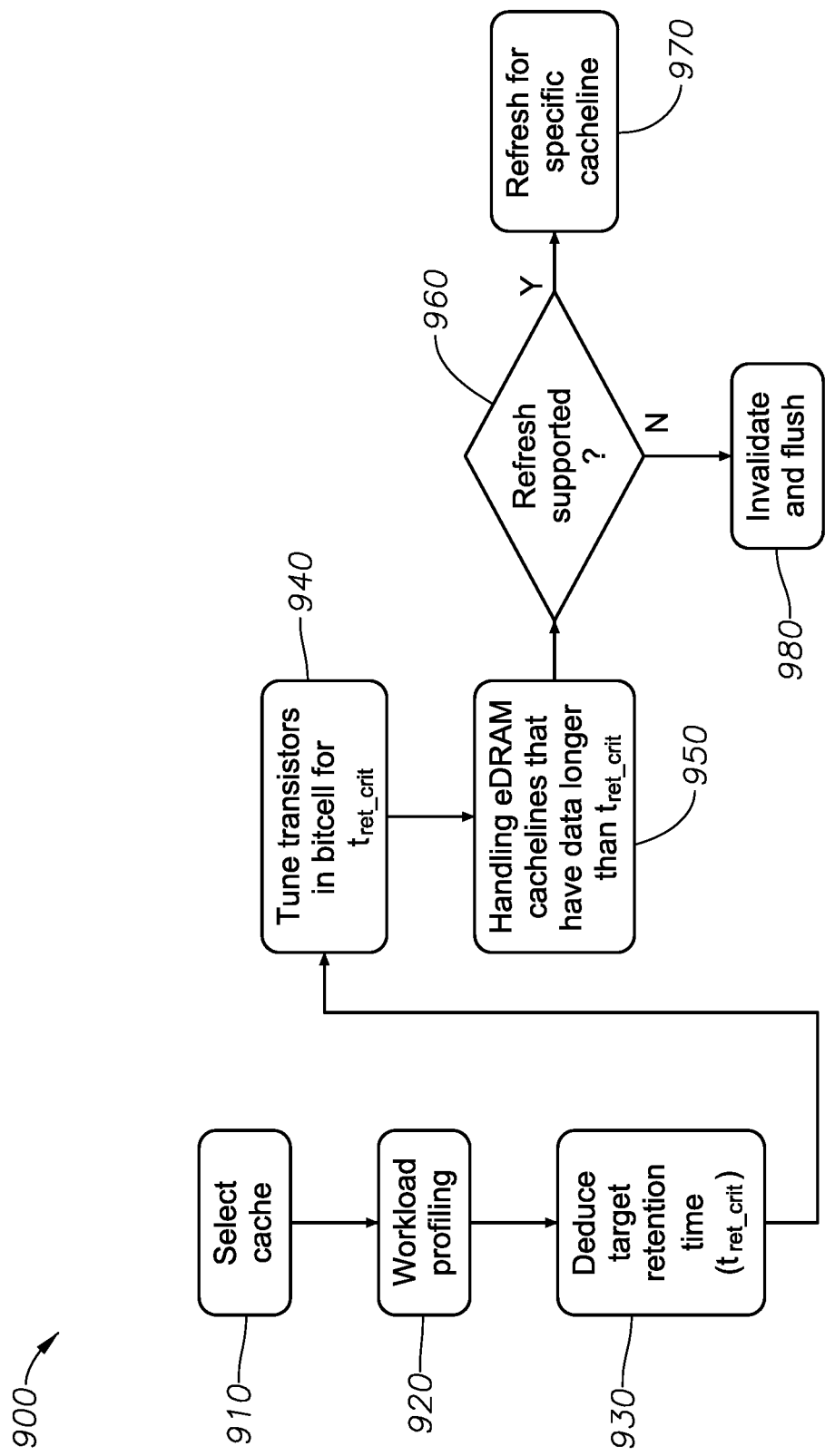
FIG. 9 is a flowchart illustrating certain aspects of various implementations described herein.

Referring to FIG. 9, an example flowchart 900 according to example implementations is shown. As illustrated, the flowchart 900 corresponds to a procedure and methodology for eDRAM Design and Workload Co-optimization. Advantageously, for example, for memories that are volatile charge-based memories, as well as MRAM (magneto-resistive random-access memory), inventive aspects provide for the capacity to determine the retention time for different caches across various cache designs (e.g., L1, L2, L3 cache) through workload profiling, and utilizing application-specific data. For instance, data would not reside in L1 cache, as long as it resides in L2 cache. Correspondingly, bitcells as well as transistors of the bitcell may be designed. Accordingly, in certain implementations, the threshold voltage of the transistors may be tuned such that a predetermined retention time may be achieved, where the target(s) for the retention time may be provided from workload profiling. Through such a matching procedure (e.g. SRAM performance matching), performance and power may be optimized.

At Step 910, a particular cache memory may be selected. For instance, this step may include an L1 instruction, branch prediction, etc. In some implementations, a particular cache-line of the cache memory may be selected. At Step 920, workload profiling would be conducted. In implementations, this step may include a study of the data lifetime for a target application. For example, for a particular type of workload (e.g., high performance or infrastructure applications) that may be run, the time duration for how long the data would reside in the cache may be assessed. This may be done at least partially through statistical analysis. Also, to ensure to make the design as "refresh-free" as possible, the process would ensure that the refresh time for the majority of the of data that requires refresh (or, for example, does not require refresh) would be below the derived threshold. Based on this criteria, a target retention time may be derived.

At Step 930, a target retention time (t ret_crit) may be deduced (e.g., computed). In doing so, an optimal retention time to minimize a refresh required may be determined and selected. At Step 940, transistors of a bitcell (e.g., bitcells 700, 800 as described with reference to FIGS. 7 and 8) may be "tuned" (i.e., balancing of various control parameters) in terms of threshold voltage inside each bitcell to synchronize to the target retention time (t ret_crit). For example, the threshold voltage for read and write transistors of the bitcell may be tuned to achieve the target retention time (t ret_crit). At this juncture, the result would be, for example, an eDRAM that is L1 cache, and would be tuned for a specific retention time that is better than or meets particular threshold. Moreover, any data that resides longer than this threshold may be flushed or may be flagged for different options. Hence, at this point, the data would have to be written back or flushed to a next level cache. At Step 950, particular eDRAM cache-lines of the cache memory that include data longer than the target retention time (t ret_crit) would be handled. In doing so, in certain implementations, at Step 960, a determination would be made whether refresh is supported or not by each of such cache-lines. If yes, at Step 970, a refresh would be conducted for the specified cache-lines. If no, at Step 980, the particular cache-line(s) would be invalidated and flushed. For example, if refresh is supported, and if the data resides longer than the threshold time, then the specific cache line may be refreshed (as per Step 970). Alternatively, if the refresh is not supported, the specific cache-line that holds the data would be invalidated and flushed. Accordingly, there would be a penalty for the cache-liens that exceed the threshold retention time. However, it is ensured that the quantity of penalties would be minimal, and that there would be no significant impact to the overall performance.

Advantageously, the above-described procedure allows for the tuning of a bitcell based on a specific cache and a specific application. Such a solution is valuable as common problem has been that designers are unable to match SRAM speed with eDRAM speed due to the need for having to refresh (despite the eDRAM utilizing less power). Nevertheless, when each bitcell has been tuned based on a workload, there now is an opportunity (i.e., some "wiggle-room") to enable the eDRAM to operate faster due to having a different target refresh time. Accordingly, the nominal supply voltage of 6T SRAM may now be matched with L1, L2, and L3 cache memory. In fact, based on the results (as shown in FIGS. 10A-B and 11A-B below), L2 and L3 cache is shown to be 20-30% in terms of dynamic power for eDRAM options (e.g. 2T GC eDRAM (e.g., corresponding to the bitcell 700), and 3T GC eDRAM (e.g., corresponding to the bitcell 800)). For instance, this is due to the use of fewer transistors, and thus, a more direct path from supply to ground.

Figure 10A:
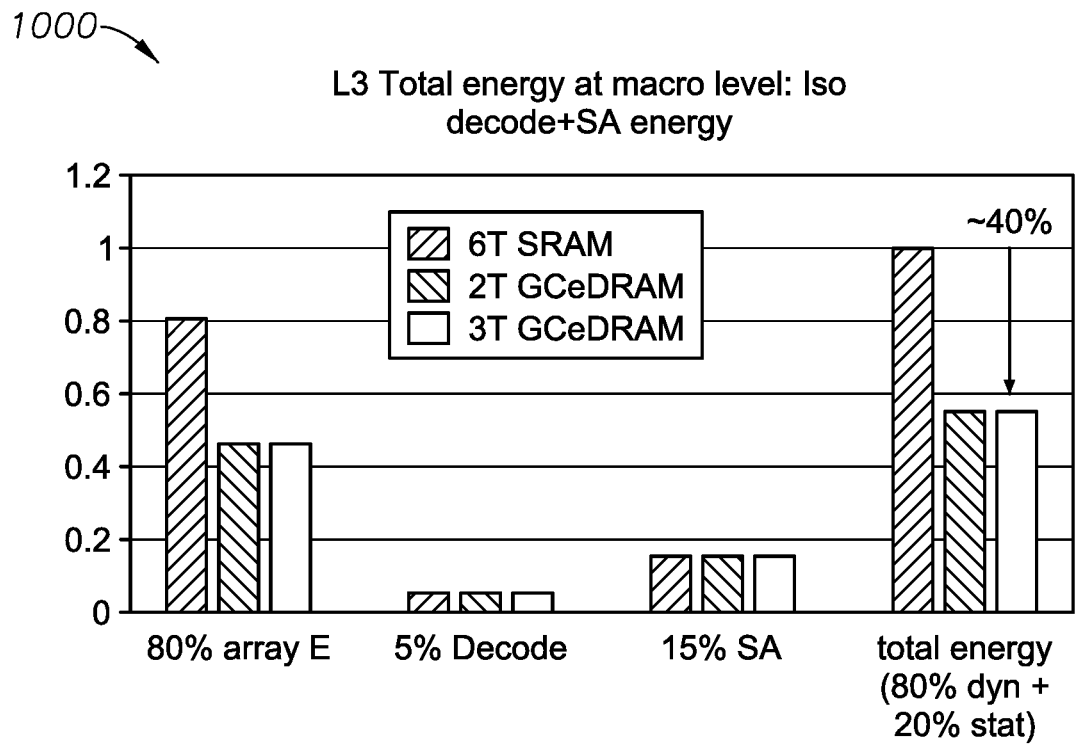
FIGS. 10A-10B are exemplary graphs in accordance with various implementations described herein.
Figure 10B:
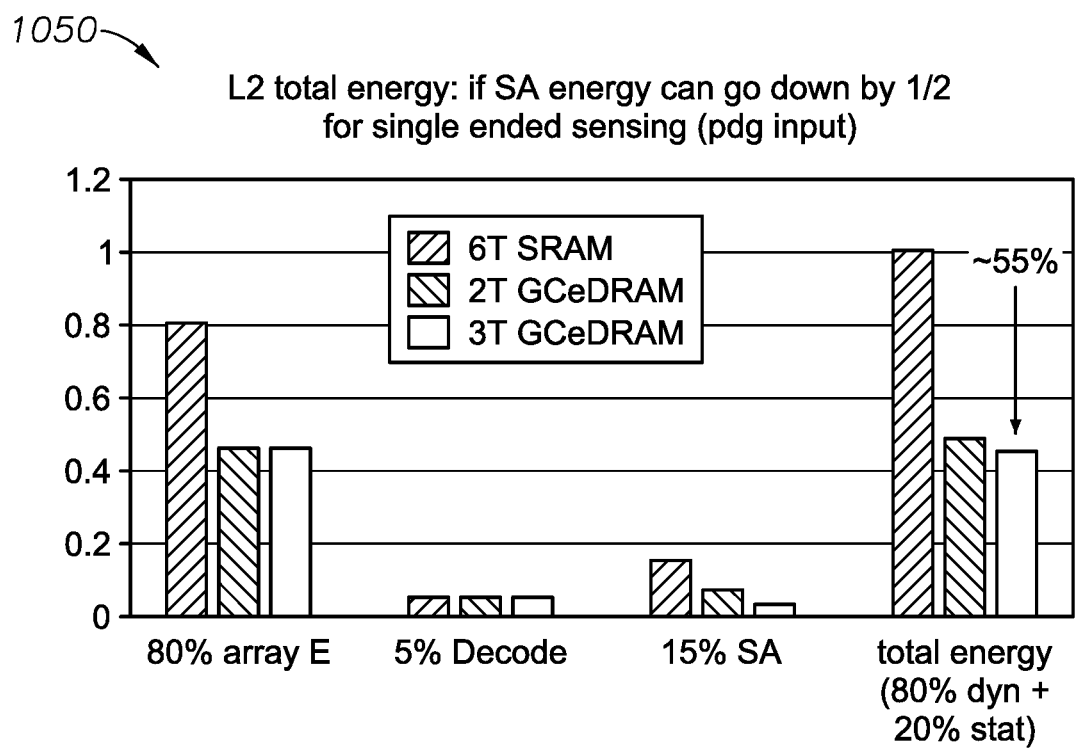

Referring to FIGS. 10A-10B, results graphs 1000, 1050 are shown according to example implementations. In FIG. 10A, a total energy for L2 cache memory at macro-level (including ISO decode and SA (i.e., sense amplifier) energy) is shown for 6T SRAM, 2T GC eDRAM (e.g., corresponding to the bitcell 700), and 3T GC eDRAM (e.g., corresponding to the bit-cell 800). As may be appreciated, advantageously, the total energy (80% dynamic+20% static) expended is tested to be approximately 40% less for the 2T GC eDRAM and the 3T GC eDRAM in comparison to the 6T SRAM. In FIG. 10B, a total energy for L2 cache memory (if SA energy can down by half for single ended sensing (pdf input)) is shown for 6T SRAM, 2T GC eDRAM (e.g., corresponding to the bitcell 700), and a 3T GC eDRAM (e.g., corresponding to the bit-cell 800). As may be appreciated, advantageously, the total energy (80% dynamic+20% static) expended is tested to be approximately 55% less for the 2T GC eDRAM and the 3T GC eDRAM in comparison to the 6T SRAM.

Figure 11A:
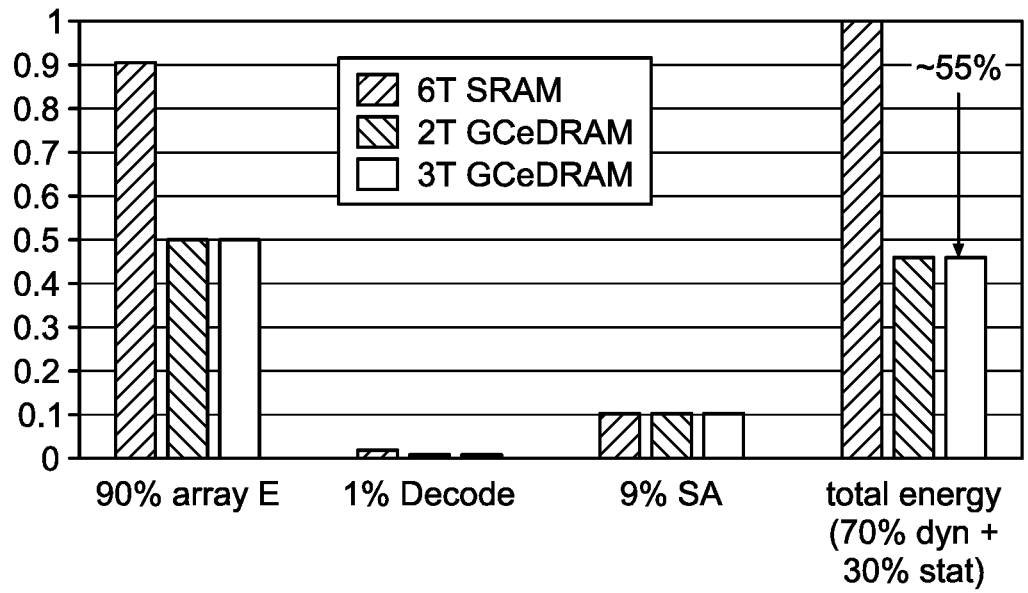
FIGS. 11A-11B are exemplary graphs in accordance with various implementations described herein.
Figure 11B:
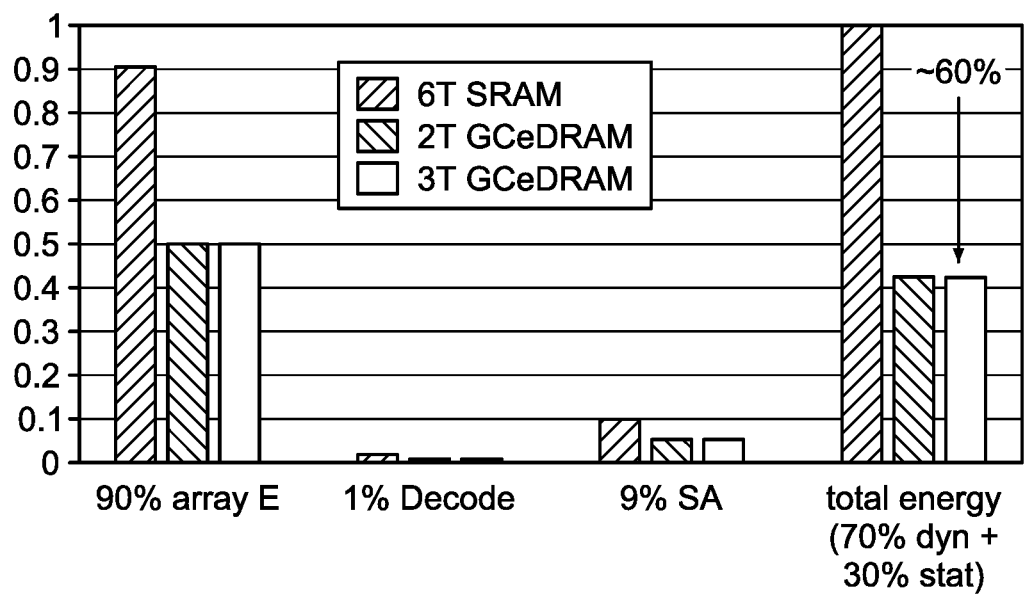

Referring to FIGS. 11A-11B, results graphs 1100, 1150 are shown according to example implementations. In FIG. 11A, a total energy for L3 cache memory at macro-level (including ISO decode and SA (i.e., sense amplifier) energy) is shown for 6T SRAM, 2T GC eDRAM (e.g., corresponding to the bitcell 700), and 3T GC eDRAM (e.g., corresponding to the bit-cell 800). As may be appreciated, advantageously, the total energy (70% dynamic+30% static) expended is tested to be approximately 55% less for the 2T GC eDRAM and the 3T GC eDRAM in comparison to the 6T SRAM. In FIG. 11B, a total energy for L3 cache memory (if SA energy can down by half for single ended sensing (pdf input)) is shown for 6T SRAM, 2T GC eDRAM (e.g., corresponding to the bitcell 700), and a 3T GC eDRAM (e.g., corresponding to the bit-cell 800). As may be appreciated, advantageously, the total energy (70% dynamic+30% static) expended is tested to be approximately 60% less for the 2T GC eDRAM and the 3T GC eDRAM in comparison to the 6T SRAM.

Figure 12:
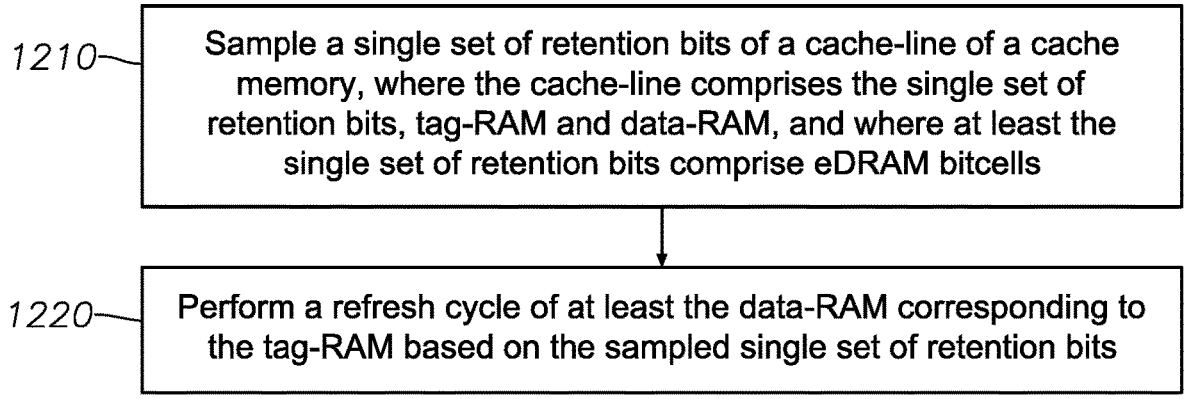
FIGS. 12-14 are operational methods of certain aspects in accordance with various implementations described herein.

Referring to FIG. 12, a flowchart of an example method 1200 (i.e., procedure) for operations to provide dynamic refresh of an data in a cache memory (e.g., a eDRAM data cache memory) is shown. Advantageously, in various implementations, the method 1200 for refresh would ensure the preservation of data in cache memory (e.g., write-through caches). Correspondingly, power, performance, and area requirements of cache memory architecture may be enhanced. The method 1200 may be implemented with reference to implementations as shown with reference to FIGS. 1-15.

At block 1210, the method 1200 includes: sampling first and second retention bits (i.e., a single set of retention bits) of a cache-line of a cache memory, wherein the cache-line comprises the single set of retention bis, tag-RAM and data-RAM, and wherein at least the single set of retention bits comprises eDRAM bitcells. For example, with reference to FIGS. 2-8 as described herein, the first and second retention bits (i.e., a single set of retention bits; R0, R1) (216, 316, 416, 516) of a cache-line of a cache memory (200, 300, 400, 500) may be sampled. Also, at least the first and second retention bits (i.e., single set of retention bits) (216, 316, 416, 516) comprise eDRAM bitcells (e.g., 700, 800). In some implementations, tag-bits (212, 412) of the tag-RAM (202, 402) and data-bits (214, 314, 414, 514) of the data-RAM (204, 304, 404, 504) include eDRAM bitcells (e.g., 700, 800).

In certain implementations, a dedicated hardware unit (e.g., including sense amplifiers, etc.) of an integrated circuit (e.g., as implemented in FIG. 15) may periodically sample the retention bits of one or more of the cache-lines. In such implementations, for instance, the time period for sampling may be chosen through empirical observation and data.

At block 1220, the method 1200 includes performing a refresh cycle of at least the data-RAM corresponding to the tag-RAM based on the sampled first and second retention bits. For example, with reference to FIGS. 2-8 as described herein, a refresh cycle of at least the data-RAM (204, 304, 404, 504) corresponding to the tag-RAM (202, 302, 402, 502) based on the sampled first and second retention bits (i.e., a single set of retention bits; R0, R1) (216, 316, 416, 516) may be performed. In certain implementations, the performing of the refresh cycle of both the data-RAM (204, 304, 404, 504) and the tag-RAM (202, 302, 402, 502) may be based on the sampled first and second retention bits (i.e., a single set of retention bits; R0, R1) (216, 316, 416, 516).

Figure 13:
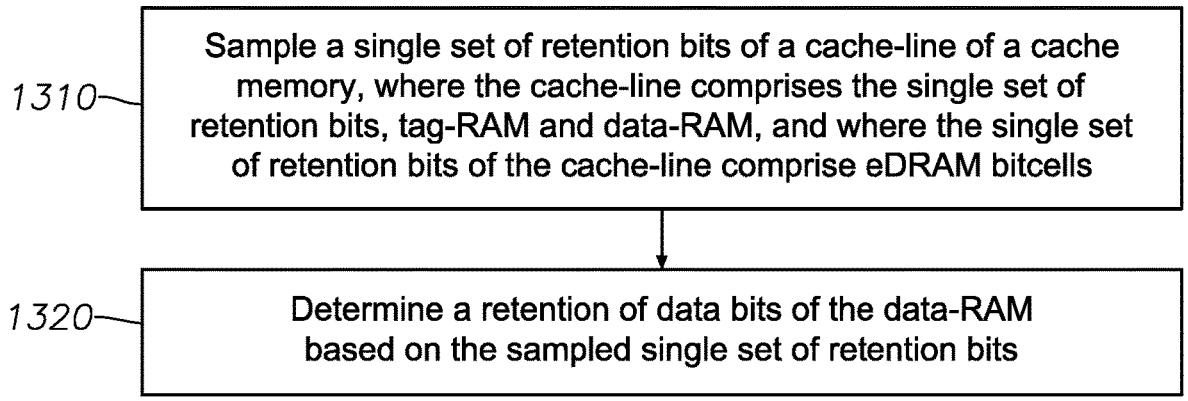

Referring to FIG. 13, a flowchart of an example method 1300 (i.e., procedure) for operations for refresh monitoring/tracking to ensure preservation of data in an instruction cache memory (e.g., a eDRAM cache memory) is shown. Advantageously, in various implementations, the method 1300 for refresh would ensure the preservation of data in cache memory (e.g., data cache memory). Correspondingly, power, performance, and area requirements of cache memory architecture may be enhanced. The method 1300 may be implemented with reference to implementations as shown with reference to FIGS. 1-15.

At block 1310, the method 1300 includes: sampling first and second retention bits (i.e., single set of retention bits) of a cache-line of a cache memory, wherein the cache-line comprises the first and second retention bits, tag-RAM and data-RAM, and wherein the first and second retention bits of the cache-line comprise (i.e., is instantiated with) eDRAM bitcells. For example, with reference to FIGS. 2-8 as described herein, the first and second retention bits (i.e., a single set of retention bits; R0, R1) (216, 316, 416, 516) of a cache-line of a cache memory (200, 300, 400, 500) may be sampled. Moreover, the cache-line may include at least the first and second retention bits (i.e., a single set of retention bits; R0, R1) (216, 316, 416, 516), the tag-RAM (202, 302, 402, 502) and the data-RAM (204, 304, 404, 504). Also, at least the first and second retention bits (i.e., a single set of retention bits; R0, R1) (216, 316, 416, 516) comprise eDRAM bitcells (e.g., 700, 800). In some implementations, tag-bits (212, 412) of the tag-RAM (202, 402) and data-bits (214, 314, 414, 514) of the data-RAM (204, 304, 404, 504) include eDRAM bitcells (e.g., 700, 800).

In certain implementations, a dedicated hardware unit (e.g., including sense amplifiers, etc.) of an integrated circuit (e.g., as implemented in FIG. 15) may periodically sample the retention bits of one or more of the cache-lines. In such implementations, for instance, the time period for sampling may be chosen through empirical observation and data.

At block 1320, the method 1300 includes determining a retention of data bits of the data-RAM based on the sampled first and second retention bits (i.e., single set of retention bits). For example, with reference to FIGS. 2-8 as described herein, the retention of data bits of the data-RAM (204, 304, 404, 504) may be determined based on the sampled first and second retention bits (i.e., a single set of retention bits; R0, R1) (216, 316, 416, 516). In certain implementations, the performing of the refresh cycle of both the data-RAM (204, 304, 404, 504) and the tag-RAM (202, 302, 402, 502) may be based on the sampled first and second retention bits (i.e., a single set of retention bits; R0, R1) (216, 316, 416, 516).

Figure 14:
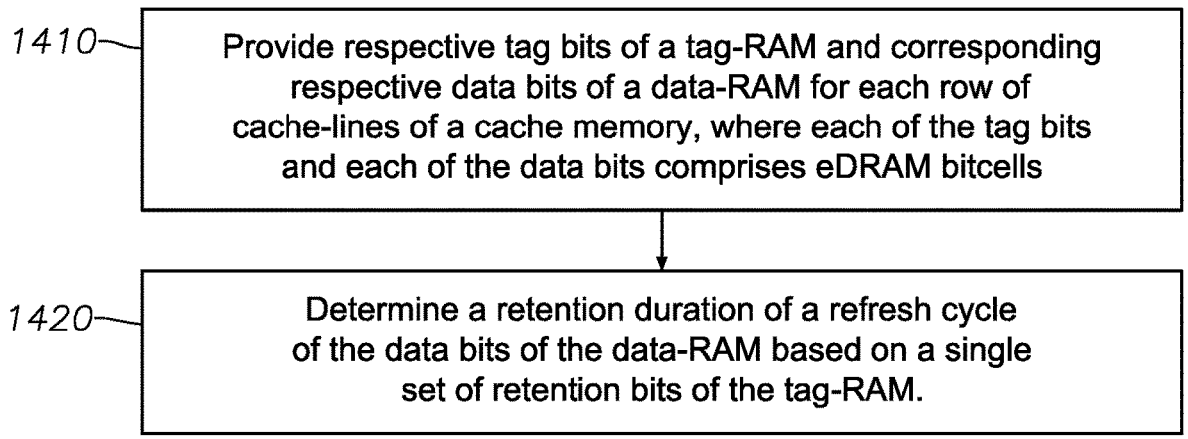

Referring to FIG. 14, a flowchart of an example operational method 1400 (i.e., procedure) for operations to provide dynamic refresh of an eDRAM cache memory is shown. Advantageously, in various implementations, the method 1400 would support power, performance, and area requirements of cache memory architecture in real-time. The method 1400 may be implemented with reference to implementations as shown with reference to FIGS. 1-15.

At block 1410, the method 1400 includes: providing respective tag bits of a tag-RAM and corresponding respective data bits of a data-RAM for each row of cache-lines of a cache memory, wherein each of the tag bits and each of the data bits comprises (i.e., is instantiated with) embedded-dynamic random access memory (eDRAM) bitcells. For instance, with reference to FIGS. 2 and 4, respective tag bits (212, 412) of a tag-RAM (202, 402) and corresponding respective data bits (214, 414) of a data-RAM (204, 404) for each row of cache-lines of a cache memory may be provided, where each of the tag bits (212, 412) and each of the data bits (214, 414) comprises (i.e., is instantiated with) embedded-dynamic random access memory (eDRAM) bitcells.

At block 1420, the method 1400 includes: determining (e.g., tracking) a retention duration (i.e., a retention, a "need") of a refresh cycle (i.e., a refresh operation) of the data bits of the data-RAM based on (e.g., a deteriorated") first and second retention bits (i.e., R0, R1, a single set of retention bits) of the tag-RAM. For instance, with reference to FIGS. 2 and 4, a retention duration of a refresh cycle of the data bits (214, 414) of the data-RAM (204, 404) based on (a "replica technique" of) first and second retention bits (i.e., R0, R1, a single set of retention bits) of the tag-RAM (202, 204) may be determined (e.g., tracked).

In certain implementations, with reference to FIGS. 12-14, the determination of the refresh cycle (e.g., determination of the retention duration of the refresh cycle) includes: 1) performing a write operation of a first logic value (e.g., "0") and second logic value (e.g., "1") to the respective first and second retention bits, where the first logic value and second logic value are "deteriorated" ("weak") bits; and 2) performing a read operation of the first and the second retention bits until the first and second retention bits are substantially equal (e.g., in such a process, after some time, the difference between the "1" and "0" would not be distinguishable).

In certain implementations, with reference to FIGS. 12-14, the determination of the refresh cycle includes sampling (e.g., polling) just the first and second retention bits of the tag-RAM (in addition to the tag bits) to detect the need for refreshing the data bits. Advantageously, by only polling the tag-RAM (e.g., the first and second retention bits and tag bits) whether a refresh is required would provide savings both in terms speed and power. Moreover, in certain instances, only data-RAM may be read when a refresh requirement is indicated by the retention bits (e.g., the retention bits of the tag-RAM).

In certain implementations, with reference to FIGS. 12-14, the determination of the refresh cycle includes the masking of the tag bits of the tag-RAM and the data bits of the data-RAM. In some implementations, the refresh cycle comprises: 1) a read operation of the data bits of the data-RAM, and 2) a write operation of the read data bits of the data-RAM. In various cases, the first and second retention bits correspond to (initial) metadata for data-RAM retention monitoring (as these are written in pairs). Moreover, in certain cases, the first and second retention bits correspond to data stored in respective first and second canary circuits.

As may be appreciated, in certain implementations, the performing of the refresh cycle comprises: the determining of a retention duration of the refresh cycle as described in above paragraphs. Moreover, in some implementations, the determination of a retention of data bits of a data-RAM may comprises the performing of the refresh cycle of the data bits (214, 314, 414, 514) of the data-RAM (204, 304, 404, 504) based on (a "replica technique" of) first and second retention bits (i.e., R0, R1, a single set of retention bits) of the tag-RAM (202, 204) may be determined (e.g., tracked).

Figure 15:
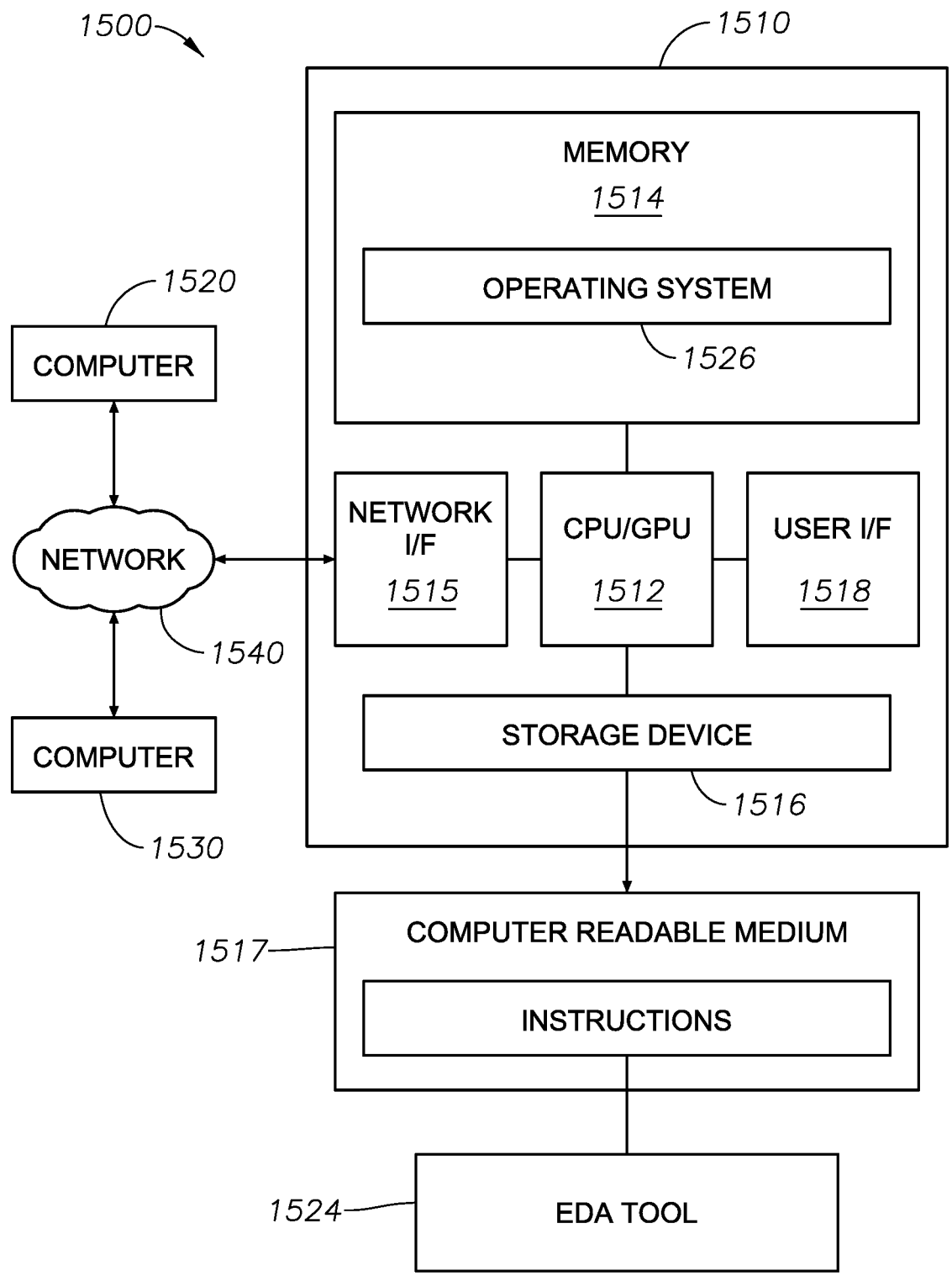
FIG. 15 is a block diagram in accordance with various implementations described herein.

FIG. 15 illustrates example hardware components in a computer system 1500. In some implementations, the computer system 1500 may be a memory compiler system. The system 1500, in various implementations, can be utilized for or in concurrent operations to: generate one or more of memory device tuning (with reference to FIG. 9), integrated circuit design, memory architecture output, logic design, memory macros, interconnect and BEOL design; determine optimal transistor level, integrated circuit level, EDA optimization, system-level design and maximum frequency optimization, and multi-tier system level optimization. In certain implementations, the example computer system 1500 (e.g., networked computer system and/or server) may include electronic design automation tool (EDA) (1524) (e.g., layout generation and extraction tools, and device and process modelling tools, circuit design tools, etc.) and execute software based on the procedure as described with reference to at least methods 1200, 1300, 1400, and other methods as described throughout the disclosure and as referenced with reference to FIGS. 1-15. In certain implementations, the EDA tool 1524 may be included as a feature of an existing memory compiler software program allowing users to input power grid and cell layout criteria, and generate power grids and cell layouts accordingly.

In certain cases, the EDA tool 1524 may provide generated computer-aided physical layout designs for memory architecture. The procedures 1200 to 1400 (and other procedures discussed throughout the disclosure) may be stored as program code as instructions 1517 in the computer readable medium of the storage device 1516 (or alternatively, in memory 1514) that may be executed by the computer 1510, or networked computers 1520, 1530, other networked electronic devices (not shown) or a combination thereof. In certain implementations, each of the computers 1510, 1520, 1530 may be any type of computer, computer system, or other programmable electronic device. Further, each of the computers 1510, 1520, 1530 may be implemented using one or more networked computers, e.g., in a cluster or other distributed computing system.

In certain implementations, the system 1500 may be used with semiconductor integrated circuit (IC) designs that contain all standard cells, all blocks or a mixture of standard cells and blocks. In a particular example implementation, the system 1500 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 1500 may be stored in one or more of memory 1514 or storage devices 1516 of computer 1510 or in networked computers 1520, 1520.

In certain implementations, the system 1500 may perform the following functions automatically, with variable user input: determination of read current requirements/thresholds (i.e., Iread), determination of leakage current requirements/thresholds (i.e., Ileak), identification of logic designs (i.e., periphery circuit designs (i.e., logic threshold voltages, threshold voltage implant layers)), determination of a desired threshold voltage-combination, determination of minimum voltage assist requirements (i.e., Vmin assist), identification of bit-cell types, determination of memory specific optimization modes (memory optimization mode), floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 1500 to produce the target results that are required by a designer. In certain implementations, the system 1500 may also provide for the capability to manually perform functions such as: cell region creation, block placement, pad and cell placement (before and after automatic placement), net routing before and after automatic routing and layout editing. Moreover, verification functions included in the system 1500 may be used to determine the integrity of a design after, for example, manual editing, design rule checking (DRC) and layout versus schematic comparison (LVS).

In one implementation, the computer 1500 includes a central processing unit (CPU) or graphical processing unit (GPU) 1512 having at least one hardware-based processor coupled to a memory 1514. The memory 1514 may represent random access memory (RAM) devices of main storage of the computer 1510, supplemental levels of memory (e.g., cache memories, non-volatile or backup memories (e.g., programmable or flash memories), read-only memories, or combinations thereof. In addition to the memory 1514, the computer system 1500 may include other memory located elsewhere in the computer 1510, such as cache memory in the CPU 1512, as well as any storage capacity used as a virtual memory (e.g., as stored on a storage device 1516 or on another computer coupled to the computer 1510).

The computer 1510 may further be configured to communicate information externally. To interface with a user or operator (e.g., a circuit design engineer), the computer 1510 may include a user interface (I/F) 1518 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 1510 may include a network interface (I/F) 1515 which may be coupled to one or more networks 1540 (e.g., a wireless network) to enable communication of information with other computers and electronic devices. The computer 1560 may include analog and/or digital interfaces between the CPU 1512 and each of the components 1514, 1515, 1516, and 1518. Further, other non-limiting hardware environments may be used within the context of example implementations.

The computer 1510 may operate under the control of an operating system 1526 and may execute or otherwise rely upon various computer software applications, components, programs, objects, modules, data structures, etc. (such as the programs associated with the procedures e.g., 1200, 1300, 1400, and related software). The operating system 1528 may be stored in the memory 1514. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 1526 in the example of FIG. 15 is shown in the memory 1514, but components of the aforementioned software may also, or in addition, be stored at non-volatile memory (e.g., on storage device 1516 (data storage) and/or the non-volatile memory (not shown). Moreover, various applications, components, programs, objects, modules, etc. may also execute on one or more processors in another computer coupled to the computer 1510 via the network 1540 (e.g., in a distributed or client-server computing environment) where the processing to implement the functions of a computer program may be allocated to multiple computers 1520, 1530 over the network 1540.

In example implementations, circuit macro diagrams have been provided in certain figures described herein, whose redundant description has not been duplicated in the related description of analogous circuit macro diagrams. It is expressly incorporated that the same cell layout diagrams with identical symbols and/or reference numerals are included in each of embodiments based on its corresponding figure(s).

Although one or more of FIGS. 1-15 may illustrate systems, apparatuses, or methods according to the teachings of the disclosure, the disclosure is not limited to these illustrated systems, apparatuses, or methods. One or more functions or components of any of FIGS. 1-15 as illustrated or described herein may be combined with one or more other portions of another of FIGS. 1-15. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 1514, the storage device 1516, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A cache memory comprising:
a plurality of cache-lines, wherein each row of cache-lines comprises:
tag bits of a tag-random access memory (tag-RAM);
data bits of a data-random access memory (data-RAM), and
a single set of retention bits corresponding to the tag-RAM, wherein:
the single set of retention bits corresponds to meta-data for data-RAM retention monitoring; and
a refresh cycle of the data-RAM is performed based on a sampling of the single set of retention bits.

2. The cache memory of claim 1, wherein the single set of retention bits corresponds to both the tag-RAM and the data-RAM.

3. The cache memory of claim 1, wherein the tag-RAM and data-RAM comprise embedded-dynamic random access memory (eDRAM) bitcells.

4. The cache memory of claim 1, wherein the tag bits comprise static random access memory (SRAM) bitcells.

5. The cache memory of claim 4, wherein the single set of retention bits and the data-RAM comprise embedded-dynamic random access memory (eDRAM) bitcells.

6. The cache memory of claim 1, wherein:
the single set of retention bits is configured to provide an indication to perform the refresh cycle of the data-RAM of at least one row of cache-lines.

7. The cache memory of claim 1, wherein:
the first and second retention bits correspond to data stored in respective first and second canary circuits, and
the single set of retention bits comprises a lower retention duration in comparison to the tag bits and the data bits.

8. The cache memory of claim 1, wherein each of the cache-lines solely comprises:
the tag bits of the tag-RAM, the data bits of the data-RAM, and the single set of the retention bits.

9. The cache memory of claim 1, wherein the single set of retention bits is configured to indicate a validity of a cache-line of the plurality of a cache-lines.

10. The cache memory of claim 1, wherein the tag-RAM is configured to identify a particular data from main memory stored in a cache-line of the plurality of cache-lines.

11. A method comprising:
sampling a single set of retention bits of a cache-line of a cache memory, wherein the cache-line comprises the single set of retention bits, tag-RAM and data-RAM, and wherein at least the single set of retention bits comprise eDRAM bitcells; and
performing a refresh cycle of at least the data-RAM corresponding to the tag-RAM based on the sampled single set of retention bits.

12. The method of claim 11, wherein tag bits of the tag-RAM and data bits of the data-RAM comprise eDRAM bitcells, and further comprising: performing the refresh cycle of the data-RAM and the tag-RAM based on the sampled first and second retention bits.

13. The method of claim 11, wherein performing the refresh cycle comprises: determining a retention duration of the refresh cycle.

14. The method of claim 13, wherein determining the retention duration comprises:
   performing a write operation of a first logic value and a second logic value to the respective first and second retention bits, wherein the first logic value and the second logic value are deteriorated bits; and
   performing a read operation of the first and the second retention bits until the first and second retention bits are substantially equal.

15. The method of claim 13, wherein performing the refresh cycle comprises:
   sampling the single set of retention bits of the tag-RAM to detect a refresh of the data bits of the data-RAM.

16. The method of claim 13, wherein performing the refresh cycle comprises:
   masking the tag bits of the tag-RAM and the data bits of the data-RAM.

17. The method of claim 13, wherein the refresh cycle comprises:
   a read operation of the data bits of the data-RAM, and
   a write operation of the read data bits of the data-RAM.

18. The method of claim 13, wherein the first and second retention bits correspond to metadata for the data-RAM.

19. The method of claim 13, wherein the first and second retention bits correspond to data stored in respective first and second canary circuits.

* * * * *